(12) United States Patent
Ho et al.

(10) Patent No.: US 9,299,459 B2
(45) Date of Patent: Mar. 29, 2016

(54) METHOD AND APPARATUS OF MEASURING ERROR CORRECTION DATA FOR MEMORY

(71) Applicant: Macronix International Co., Ltd., Hsinchu (TW)

(72) Inventors: Kin-Chu Ho, Lok Yueng Garden (CN); Hsiang-Pang Li, Zhubei (TW); Hsie-Chia Chang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 192 days.

(21) Appl. No.: 13/866,834

(22) Filed: Apr. 19, 2013

(65) Prior Publication Data

US 2014/0082440 A1      Mar. 20, 2014

Related U.S. Application Data

(60) Provisional application No. 61/701,422, filed on Sep. 14, 2012, provisional application No. 61/698,280, filed on Sep. 7, 2012.

(51) Int. Cl.
*G11C 29/00*      (2006.01)
*G11C 29/50*      (2006.01)
(Continued)

(52) U.S. Cl.
CPC ...... *G11C 29/50004* (2013.01); *G06F 11/1048* (2013.01); *G11C 11/5642* (2013.01); *G11C 29/021* (2013.01); *G11C 29/028* (2013.01); *G11C 29/42* (2013.01)

(58) Field of Classification Search
CPC ........ G11C 29/50; G11C 16/04; G11C 29/02; G11C 29/028; H05K 999/99

USPC .......................................................... 714/721
See application file for complete search history.

(56) References Cited

U.S. PATENT DOCUMENTS 4,903,265 A * 2/1990 Shannon .......... G11C 29/50004
                                                      365/201
6,992,932 B2    1/2006 Cohen
(Continued)

FOREIGN PATENT DOCUMENTS

TW            200905692 A     2/2009

OTHER PUBLICATIONS

Polansky Y. et al., "A 4b/cell NROM 1Gb Data-Storage Memory", ISSCC Dig. Tech. Papers, Feb. 2006. pp. 448-458.

(Continued)

*Primary Examiner* — Albert Decady
*Assistant Examiner* — Enam Ahmed
(74) *Attorney, Agent, or Firm* — Kenta Suzue; Haynes Beffel & Wolfeld LLP (57) ABSTRACT

Multiple measurements are made with one memory sense operation having a first word line sensing voltage on a memory cell. The multiple measurements include a first measurement, of whether the memory cell stores either: (a) data corresponding to a first set of one or more threshold voltage ranges below the first word line sensing voltage of the one memory sense operation, or (b) data corresponding to a second set of one or more threshold voltage ranges above the first word line sensing voltage of the one memory sense operation. The multiple measurements include a second measurement, of error correction data of the memory cell indicating relative position within a particular threshold voltage range of a stored threshold voltage in the memory cell.

18 Claims, 7 Drawing Sheets

(51) Int. Cl.
  *G11C 11/56* (2006.01)
  *G11C 29/02* (2006.01)
  *G11C 29/42* (2006.01)
  *G06F 11/10* (2006.01)

(56) References Cited

U.S. PATENT DOCUMENTS

| | | | |
|---|---|---|---|
| 7,966,546 B2 | 6/2011 | Mokhlesi et al. | |
| 7,966,550 B2 | 6/2011 | Mokhlesi et al. | |
| 8,605,513 B2 | 12/2013 | Hemink | |
| 2003/0217323 A1* | 11/2003 | Guterman et al. | 714/763 |
| 2008/0285351 A1* | 11/2008 | Shlick et al. | 365/185.18 |
| 2013/0069623 A1* | 3/2013 | Fort | G11C 7/062 324/76.11 |

OTHER PUBLICATIONS

Shibata N. et al., "A 19nm 112.8mm2 64Gb Multi-Level Flash Memory with 400Mb/s/pin 1.8V Toggle Mode Interface," ISSCC Dig. Tech. Papers, Feb. 2012, pp. 422-424.

Tanakamaru S. et al., "Over-10x-Extended-Lifehme 76%-Reduced-Error Solid-State Drives (SSDs) with Error-Prediction LDPC Architecture and Error-Recovery Scheme," ISSCC Dig. Tech Papers, Feb. 2012. pp. 424-426.

Ho K-C. et al., "A 45nm 6bit/cell Charge-Trapping Flash Memory using LDPC-based ECC and Drift-Immune Soft Sensing Engine" Solid-State Circuits Conf. Dig. of Tech Papers (ISSCC), IEEE Int'l, Feb. 2013, San Francisco, paper 12.7, pp. 222-223 + 1 continuation pg.

* cited by examiner

METHOD AND APPARATUS OF MEASURING ERROR CORRECTION DATA FOR MEMORY

REFERENCE TO RELATED APPLICATION

This application claims the benefit of U.S. Provisional Patent Application No. 61/701,422 filed 14 Sep. 2012, and claims the benefit of U.S. Provisional Patent Application No. 61/698,280 filed 7 Sep. 2012, which is are incorporated herein by reference.

BACKGROUND

1. Field of the Invention

This technology relates to performing read operations on memory.

2. Description of Related Art

A typical sense operation to measure the data stored in a memory cell indicates only whether the memory cell stores a threshold voltage is within one of several threshold voltage ranges representing different data values. As a result, additional sense operations are required to measure not just the particular threshold voltage range corresponding to the memory cell, but whether the memory cell stores a threshold voltage that is relatively close to an extreme end of the threshold voltage range. A memory cell that stores such a threshold voltage is more likely to be misread as storing data corresponding to the adjacent threshold voltage range.

Such error correction data, also referred to as soft information, is used to determine when the result of a sensing operation on a memory cell is more likely to contain an incorrect result. However, the measurement of soft data increases read latency, because of the additional sense operations required.

SUMMARY

One aspect of the technology is a memory operation method which comprises, making a plurality of measurements with one memory sense operation having a first word line sensing voltage on a memory cell. The plurality of measurements includes a first measurement, of whether the memory cell stores either:

(a) data corresponding to a first set of one or more threshold voltage ranges below the first word line sensing voltage of the one memory sense operation, or (b) data corresponding to a second set of one or more threshold voltage ranges above the first word line sensing voltage of the one memory sense operation.

The plurality of measurements includes a second measurement, of error correction data of the memory cell, the error correction data indicating relative position within a particular threshold voltage range of the first set or second set, of a stored threshold voltage in the memory cell.

Another aspect of the technology is an integrated circuit with memory, comprising a memory array with a plurality of memory cells storing data represented by one of a plurality of threshold voltage ranges, and control circuitry coupled to the memory array. The control circuitry makes a plurality of measurements with one memory sense operation having a first word line sensing voltage on a memory cell of the memory array, the plurality of measurements being as described herein.

Yet another aspect of the technology is a method of making the integrated circuit described herein.

A further aspect of the technology is a reading method of a memory having a ECC circuitry, comprising:

sensing the memory with a first word line voltage;
adjusting the first word line voltage to a second word line voltage; and
sensing the memory with the second word line voltage to get data of the memory and error correction data of the memory cell for the ECC circuitry indicating relative position within a particular threshold voltage range of a stored threshold voltage in the memory cell.

Various embodiments of the technology are described.

In one embodiment of the technology, the error correction data indicates whether the memory cell has a stored threshold voltage within a sub-range narrower than one of a plurality of threshold voltage ranges. Different threshold voltage ranges in the plurality of threshold voltage ranges represent different data values storable by the memory cell.

In one embodiment of the technology, responsive to determining that the first word line sensing voltage results in the first measurement exceeds a predetermined error limit, the first measurement is repeated on the memory cell with a second word line sensing voltage replacing the first word line sensing voltage. The error correction data can indicate whether the memory cell has a stored threshold voltage between the first word line sensing voltage and the second word line sensing voltage. A first result of the first measurement with the first word line sensing voltage can be discarded in favor of a second result of the first measurement with the second word line sensing voltage.

One embodiment of the technology, further comprises, responsive to determining that the first word line sensing voltage results in the first measurement exceeding a predetermined error limit, repeating the first measurement on the memory cell with a succession of replacement word line sensing voltages until one of the replacement word line sensing voltages results in the first measurement meeting the predetermined error limit. The error correction data can indicate whether the memory cell has a stored threshold voltage between two of the replacement word line sensing voltages. An earlier result of the first measurement with an earlier one of the succession of replacement word line sensing voltages can be discarded in favor of a later result of the first measurement with a later one of the succession of replacement word line sensing voltages.

In one embodiment of the technology, the first measurement with the first word line sensing voltage is an intermediate word line sensing voltage in a moving read operation on the memory cell.

DETAILED DESCRIPTION

Figure 1:
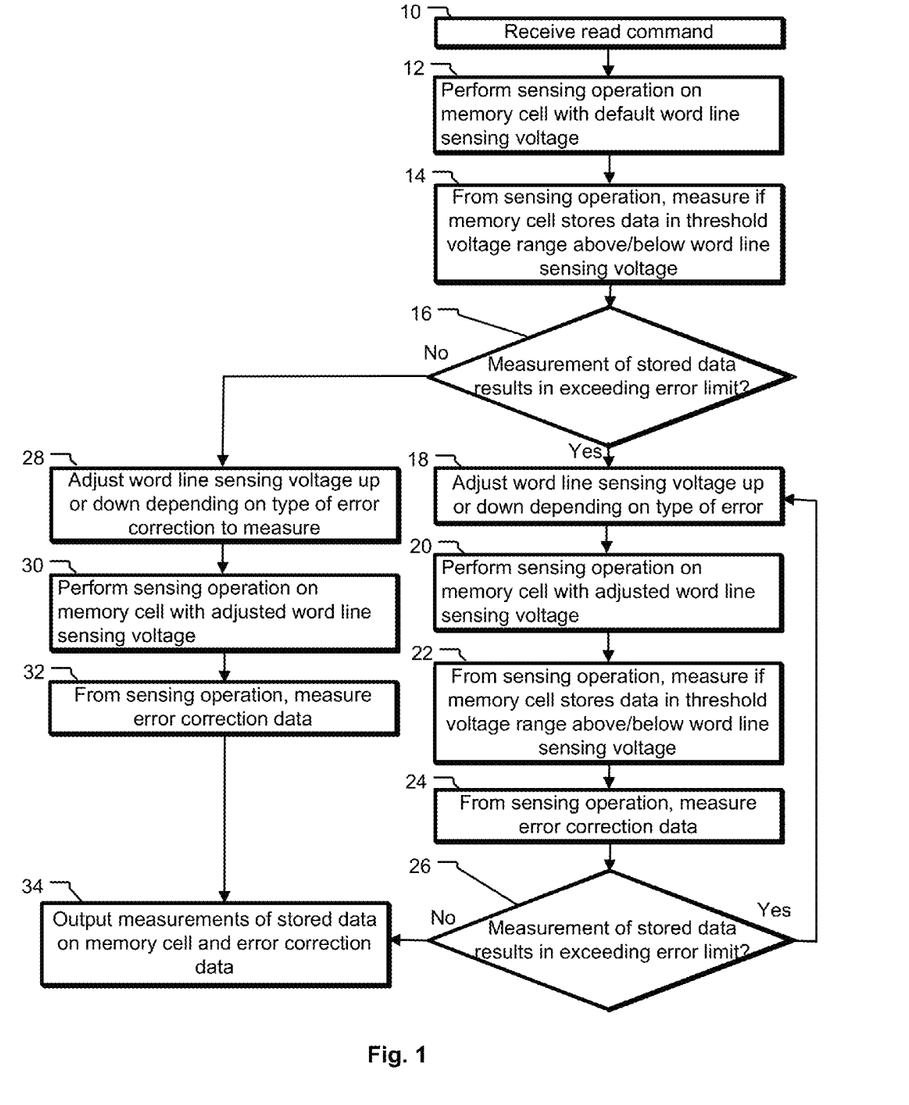
FIG. 1 is an example flowchart of making multiple measurements with the same memory sense operation.

FIG. 1 is an example flowchart of making multiple measurements with the same memory sense operation.

In 10, a read command is received. In 12, a sensing operation is performed on a memory cell (alternatively multiple memory cells) with a default word line sensing voltage. In 14, from the results of the sensing operation, a measurement is made of the memory cells of whether the memory cell stores data in a threshold voltage range above or below the word line sensing voltage. In this measurement, as a result of applying the word line sensing voltage to the gate of the measured memory cell, sufficient current flows through the memory cell as a result of the measured threshold voltage being at or below the word line sensing voltage, or insufficient current flows through the memory cell as a result of the measured threshold voltage above the word line sensing voltage.

In 16, a control circuit determines whether a result of the measurement 14 exceeds a predetermined error limit. This determination controls whether the same sensing operation can make multiple measurements (18-26), or whether multiple measurements require multiple sensing operations (28-32).

If yes, then in 18, the word line sensing voltage is adjusted up or down depending on the type of error. One type of error is that too many memory cells are measured as storing data corresponding to a threshold voltage range below the word line sensing voltage. Another type of error is that too many memory cells are measured as storing data corresponding to a threshold voltage range above the word line sensing voltage. In 20, another sensing operation is performed on the memory cell with the adjusted word line sensing voltage. In 22, from the sensing operation of 20, the control circuit measures whether the memory cell stores data in a threshold voltage range above or below the adjusted word line sensing voltage. Further discussion about the preceding moving read operation with a changing word line sensing voltage is discussed below in connection with FIGS. 2 and 3.

In 24, again from the sensing operation of 20, error correction data are measured. An example of error correction data is whether the memory cell stores data with a threshold voltage in between the present word line sensing voltage and a previous word line sensing voltage, such as the immediately previous word line sensing voltage.

By using the results of the same sensing operation 22 in both the measurement of the stored data in 22 and the measurement of error correction data in 24, read latency is decreased by decreasing the number of sensing operations.

In 26—as in 16—a control circuit determines whether a result of the measurement 22 exceeds a predetermined error limit. If no, then in 34 the measurements are output and the present read is over. If yes, then the process flow loops back to 18.

If in 16, a control circuit determined that a result of the measurement 14 did not exceed a predetermined error limit, then the process flow continues with 28-32.

In 28, the word line sensing voltage is adjusted up or down depending on the type of error correction to be measured. One type of error correction is that the data stored by the memory cell is represented by a threshold voltage range above the word line sensing voltage. Another type of error correction is that the data stored by the memory cell is represented by a threshold voltage range below the word line sensing voltage. In 30, another sensing operation is performed on the memory cell with the adjusted word line sensing voltage. In 32, from the sensing operation of 30, the control circuit measures whether the memory cell stores data in a threshold voltage range in between the present word line sensing voltage and a previous word line sensing voltage, such as the immediately previous word line sensing voltage.

Further discussion about this measurement of error correction data with a changing word line sensing voltage is discussed below in connection with FIG. 4. In 34 the measurements are output and the present read is over.

Figure 2:
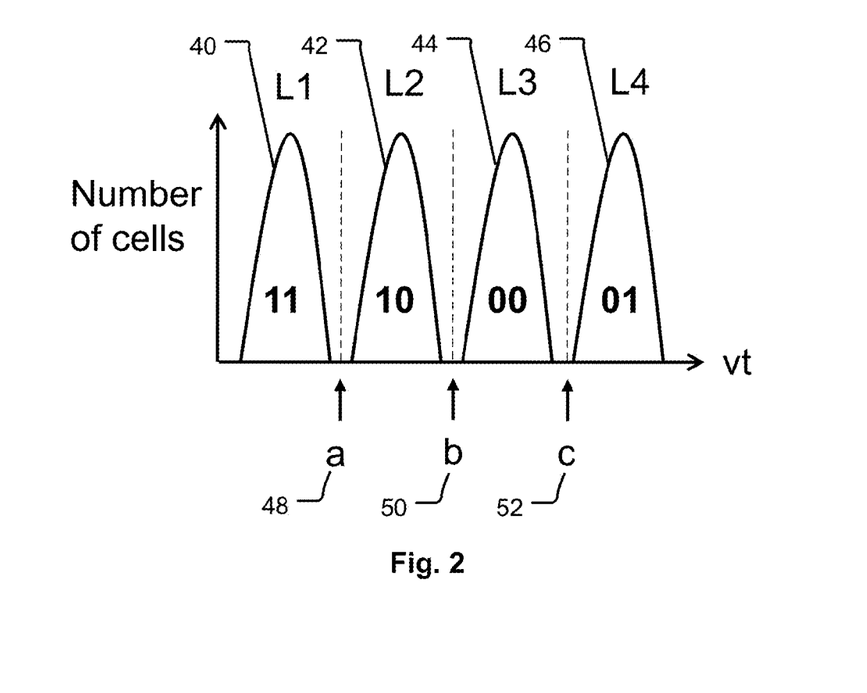
FIGS. 2 and 3 are graphs of the threshold voltage distribution of memory cells, demonstrating an example of a changing word line sensing voltage when measuring data stored on memory cells in a moving read operation.
Figure 3:
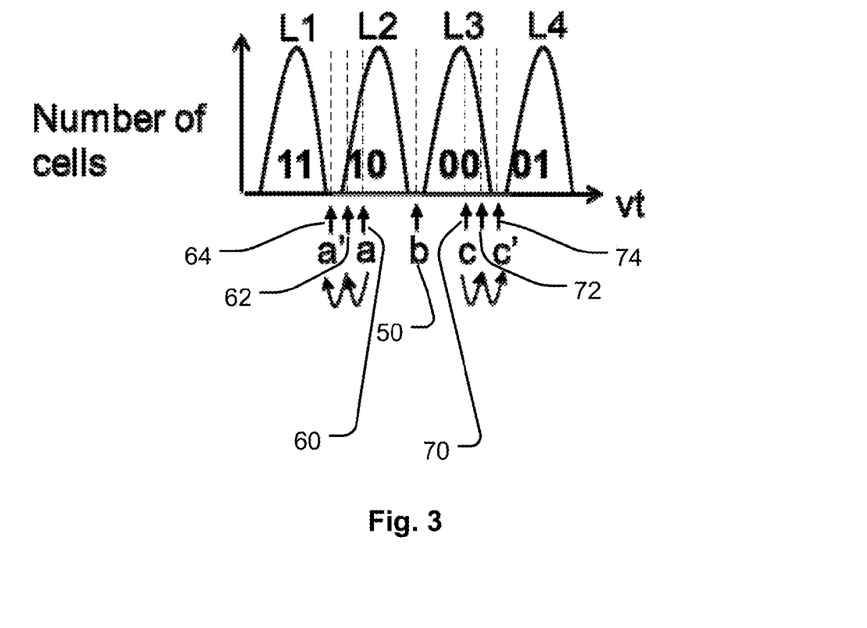

FIGS. 2 and 3 are graphs of the threshold voltage distribution of memory cells, demonstrating an example of a changing word line sensing voltage when measuring data stored on memory cells in a moving read operation.

Although FIG. 2 shows the threshold voltage distribution of a multi-level cell with four logical levels, in other embodiments are directed to a simple two-level cell, or to a multi-level cell with more than four logical levels. FIG. 2 has four threshold voltage distributions 40, 42, 44, and 46 which respectively corresponding to four logical levels L1 (bits 11), L2 (bits 10), L3 (bits 00), and L4 (bits 01).

A sensing operation with word line sensing voltage b 50 is accompanied by a measurement of whether the memory cell stores a threshold voltage representing data corresponding to a threshold voltage range above (e.g. L3 and L4) or below (e.g. L1 and L2) word line sensing voltage b 50.

A sensing operation with word line sensing voltage a 48 is accompanied by a measurement of whether the memory cell stores a threshold voltage representing data corresponding to a threshold voltage range above (e.g. L2) or below (e.g. L1) word line sensing voltage a 48.

A sensing operation with word line sensing voltage c 52 is accompanied by a measurement of whether the memory cell stores a threshold voltage representing data corresponding to a threshold voltage range above (e.g. L4) or below (e.g. L3) word line sensing voltage c 52.

FIG. 3 illustrates additional details for a moving-read operation. The default word line sending voltages a 60 and c 70 are substantially nonoptimal, as they do not have intermediate values in between threshold voltage ranges.

Before programming data to the memory, the number of cells is counted with threshold voltage (Vt) below each WL sensing voltage (a, b, c) in a page.

$R_{L1}$ is the number of cells located at L1 (Vt below WL sensing voltage a).

$R_{L2}$ is the number of cells located at L1 and L2 (Vt below WL sensing voltage b).

$R_{L3}$ to the number of cells located at L1, L2 and L3 (Vt below WL sensing voltage c).

In one example, reading the second data bit requires two WL sensing voltages. First, the WL sensing voltage is set to WL sensing voltage a, and the bit "1" of the sensing result ($T_{L1}$) is counted. $T_{L1}$ refers to the number of cells with Vt below WL sensing voltage a.

Define $\Delta_{L1} = R_{L1} - T_{L1}$. If $\Delta_{L1}$ is smaller than a predetermined error limit (e.g. $-M1 < \Delta_{L1} < M2$), then an optimal WL sensing voltage is found. Otherwise, the WL sensing voltage is adjusted until an optimal WL sensing voltage a' is found between the threshold voltage ranges for levels L1 and L2. In FIG. 3, the default WL sensing voltage a 60 is adjusted twice (62 then 64) until reaching an optimal WL sensing voltage a'.

Then, the WL sensing voltage is set to WL sensing voltage c and the same procedure is repeated to find an optimal WL sensing voltage c' between the threshold voltage ranges for levels L3 and L4. In FIG. 3, the default WL sensing voltage c 70 is adjusted twice (72 then 74) until reaching an optimal WL sensing voltage c'.

Figure 4:
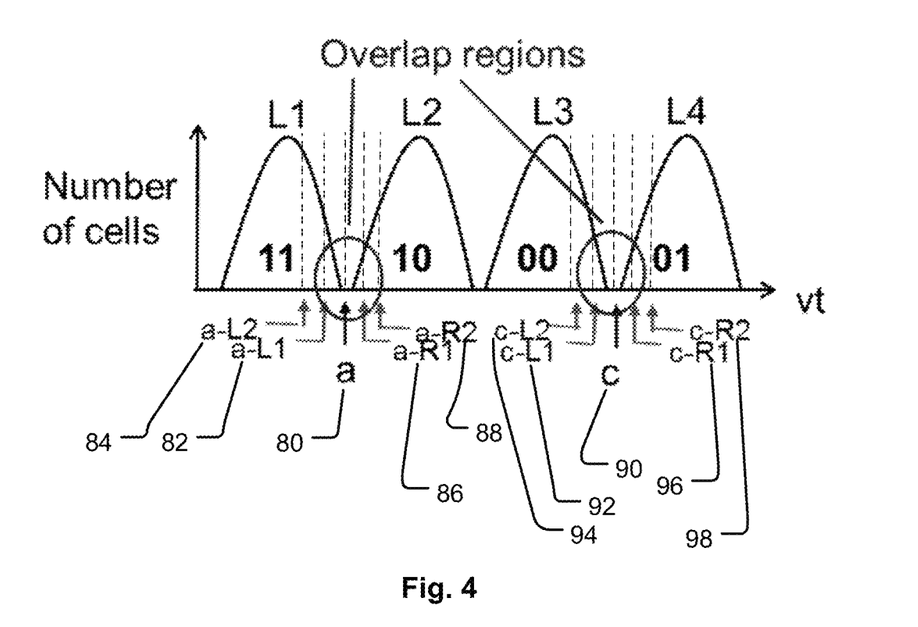
FIG. 4 is a graph of the threshold voltage distribution of memory cells, demonstrating an example of measuring error correction data in a read operation.

FIG. 4 is a graph of the threshold voltage distribution of memory cells, demonstrating an example of measuring error correction data in a read operation.

Reading the second data bit of two data bits, requires a second read operation. The two WL sensing voltages have values of a and c. The second data bit is decoded to be 0 if the threshold voltage is located at L2 or L3; otherwise the second data bit is decoded to be 1.

A memory cell with threshold voltage (Vt) near an optimal WL sensing voltage has a higher probability of having error. Accordingly, relative position within a threshold voltage range is measured, as a relative position near an edge of the threshold voltage range has a higher probability of having error, and a relative position near the middle of the threshold voltage range has a lower probability of having error. The multiple read operation helps to distinguish which cells have higher probability of error. The probability of error is the error correction, or soft information, used by LDPC codes.

Each memory cell has its own threshold voltage. The soft information is data about the probability of an error for a memory cell. For example, if the read voltage is 3V, a memory cell with threshold voltage near 3V has a high probability of error since it is too close to the read voltage. In contrast, a memory cell with threshold far away from 3V has a low probability of error. Each memory cell has its own soft information.

An example follows. Data "1" is stored if a memory cell's threshold voltage is below 3V, and data "0" is stored if the memory cell's threshold voltage is above 3V. Therefore, the threshold voltage of a memory cell maybe programmed to 4V if data "0" is to be stored.

However, there are many sources of noise such as program disturb, read disturb, etc. The threshold voltage of each memory cell may be shifted. For example, the threshold voltage may shift from 4V to 3.5V, shift from 4V to 3.2V, etc.

If a memory cell has a threshold voltage of 3.2V, it has a higher probability of being an error than at 4V, due to a relative position in the data "0" threshold range that is closer to 3V, or the end of the threshold voltage range. Soft information is obtained via knowledge of region of the threshold voltage of a memory cell. In other words, the soft information indicates how the threshold voltage of a memory cell is affected (shifting from 4V to 3.2V). Since the shift distance of the threshold voltage of each memory cell is different, that each memory cell has its own soft information.

With the actual threshold voltage value of each memory cell, the most accurate probability can be assigned to each memory cell. However, this can cause high overhead in time latency or circuit complexity. To simply this process, the threshold voltages can be defined in several regions, or narrow threshold voltage ranges. The memory cells within the same region are assigned the same probability.

To obtain soft information for WL sensing voltage a 80, extra sense operations are performed at WL sensing voltages a-L1 82 and a-R1 86 (and WL sensing voltage a-L2 84 and a-R2 88 if more soft information is needed). Similar operations are performed for WL sensing voltage c 90, with extra sense operations performed at WL sensing voltages c-L1 92 and c-R1 96 (and WL sensing voltage c-L2 94 and c-R2 98 if more soft information is needed). The difference between two sensing results indicates whether or not a particular stored threshold voltage is within the narrow threshold voltage range in between the two sensing voltages. This multiple read operation can define the overlap regions, or the overlap of two distributions, in a fine-grained manner, which helps to generate the soft information, or probability of error used by LDPC codes.

An MLC example below combines the moving-read operation and extra read operations.

To read the second data bit, it requires two WL sensing voltages. First, the WL sensing voltage is set to a, and the number of "1" of the sensing result ($T_{L1}$) is counted. $T_{L1}$ refers to the number of cells with Vt below a.

The control circuitry calculates $\Delta_{L1}=R_{L1}-T_{L1}$, with three cases:

Case 1: $-M1<\Delta_{L1}<M2$;
Case 2: $\Delta_{L1}>M2$; and
Case 3: $\Delta_{L1}<-M1$.

It is understood that the borderline cases in between two cases can be classified in either of the border cases. Each case is discussed in further detail below.

Case 1:

$\Delta_{L1}$ represents error smaller than predetermined error limits (e.g. $-M1<\Delta_{L1}<M2$). An optimal WL sensing level is found. Extra reads are performed at WL sensing voltages a-L1 and a-R1 to obtain soft information. Extra reads are performed also at WL sensing voltages a-L2 and a-R2 if more soft information is needed.

Case 2:

$\Delta_{L1}$ is too positive ($\Delta_{L1}>M2$)

This case represents that the number of "1" sensing results ($T_{L1}$) is too small. Therefore the WL sensing voltage is increased towards higher Vt. The sensing results are stored in a buffer for later use.

The sensing operation is repeated with higher WL sensing voltage, and $T_{L1}$ is counted again.

If $\Delta_{L1}$ represents error smaller than predetermined error limits, an optimal WL sensing voltage (a') is found. Since the previous sensing result is stored, the present sensing operation measures the sensing result of a'-L1. The difference between two sensing results indicates whether or not a particular stored threshold voltage is within the narrow threshold voltage range in between the two sensing voltages. The WL sensing voltage is adjusted to a'-R1 and the sensing operation is repeated to measure remaining soft information. The difference between two sensing results indicates whether or not a particular stored threshold voltage is within the narrow threshold voltage range in between the two sensing voltages.

If $\Delta_{L1}$ represents error larger than predetermined error limits, the previous sensing result in the buffer is replaced by the current sensing result. The WL sensing voltage is increased and the sensing operation is repeated.

The procedure continues until an optimal WL sensing voltage (a') is found. The WL sensing voltage is then adjusted to a'-R1 and the sensing operation is repeated to measure remaining soft information.

In Case 2, an extra sensing at WL sensing voltage a'-L1 is not necessary, because the corresponding soft information was measured during the moving read operation to search for an optimal WL sensing level and to measure the stored data.

Case 3:

$\Delta_{L1}$ is too negative ($\Delta_{L1}<-M1$)

This case represents that the number of "1" sensing results ($T_{L1}$) is too large. Therefore the WL sensing voltage is decreased towards lower Vt. The sensing results are stored in a buffer for later use.

The sensing operation is repeated with lower WL sensing voltage, and $T_{L1}$ is counted again.

If $\Delta_{L1}$ represents error smaller than predetermined error limits, an optimal WL sensing voltage (a') is found. Since the previous sensing result is stored, the present sensing operation measures the sensing result of a'-R1. The different sensing are boundaries of regions or narrow threshold voltage ranges voltages. The difference between two sensing results indicates whether or not a particular stored threshold voltage is within the narrow threshold voltage range in between the two sensing voltages. The WL sensing voltage is adjusted to a'-L1 and the sensing operation is repeated to measure remaining soft information. The difference between two sensing results indicates whether or not a particular stored threshold voltage is within the narrow threshold voltage range in between the two sensing voltages.

If $\Delta_{L1}$ represents error larger than predetermined error limits, the previous sensing result in the buffer is replaced by the current sensing result. The WL sensing voltage is decreased and the sensing operation is repeated.

The procedure continues until an optimal WL sensing voltage (a') is found. The WL sensing voltage is then adjusted to a'-L1 and the sensing operation is repeated to measure remaining soft information.

In Case 3, an extra sensing at WL sensing voltage a'-R1 is not necessary, because the corresponding soft information was measured during the moving read operation to search for the optimal WL sensing level and to measure the stored data.

Each memory cell has its own soft information. Soft information can be measured cell by cell, or can be measured for an entire memory page together.

Figure 5:
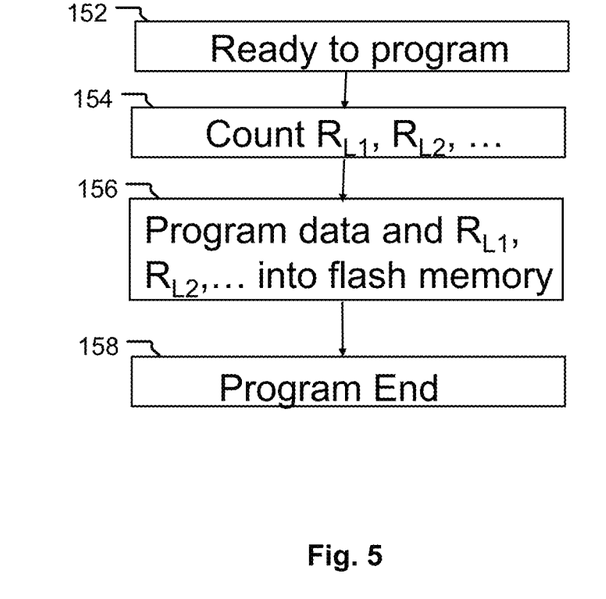
FIG. 5 is an example flow chart of programming both the results of measuring data stored on memory cells, and the results of measuring error correction data.

FIG. 5 is an example flow chart of programming both the results of measuring data stored on memory cells, and the results of measuring error correction data.

In 152, having measured the data stored in memory cells and the error correction data, the circuit is ready to program both types of measured data in memory. In 154, soft data are counted, such as the number of data cells are counted respectively in $R_{L1}$, $R_{L2}$ and $R_{L3}$. In 156, the data stored in memory cells and soft data such as the memory cell counts of $R_{L1}$, $R_{L2}$ and $R_{L3}$ are programmed into memory.

Figure 6:
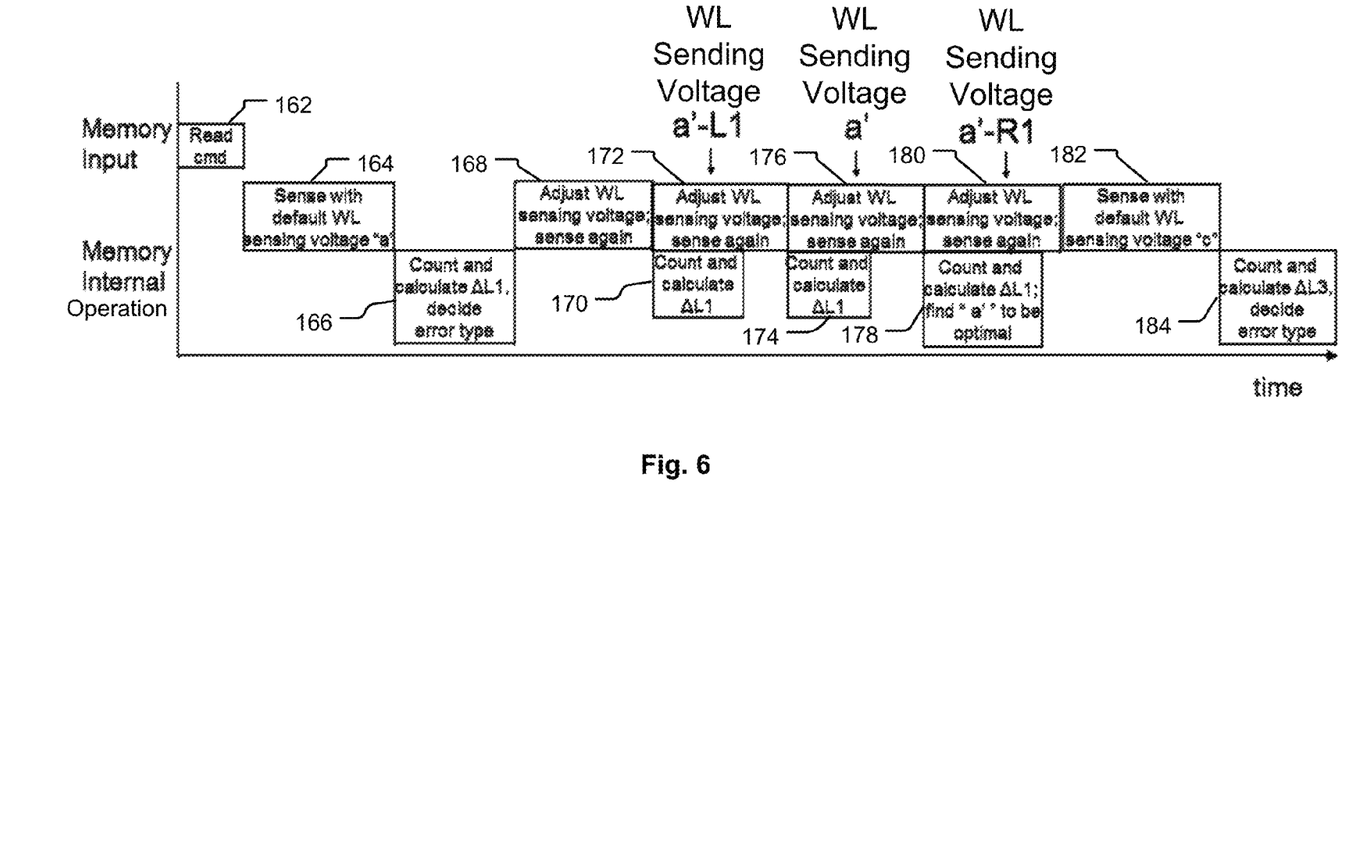
FIGS. 6 and 7 are an example timeline of a read operation which includes a combined measurements of data stored on memory cells of error correction data of the memory cells from the same memory sense operation
Figure 7:
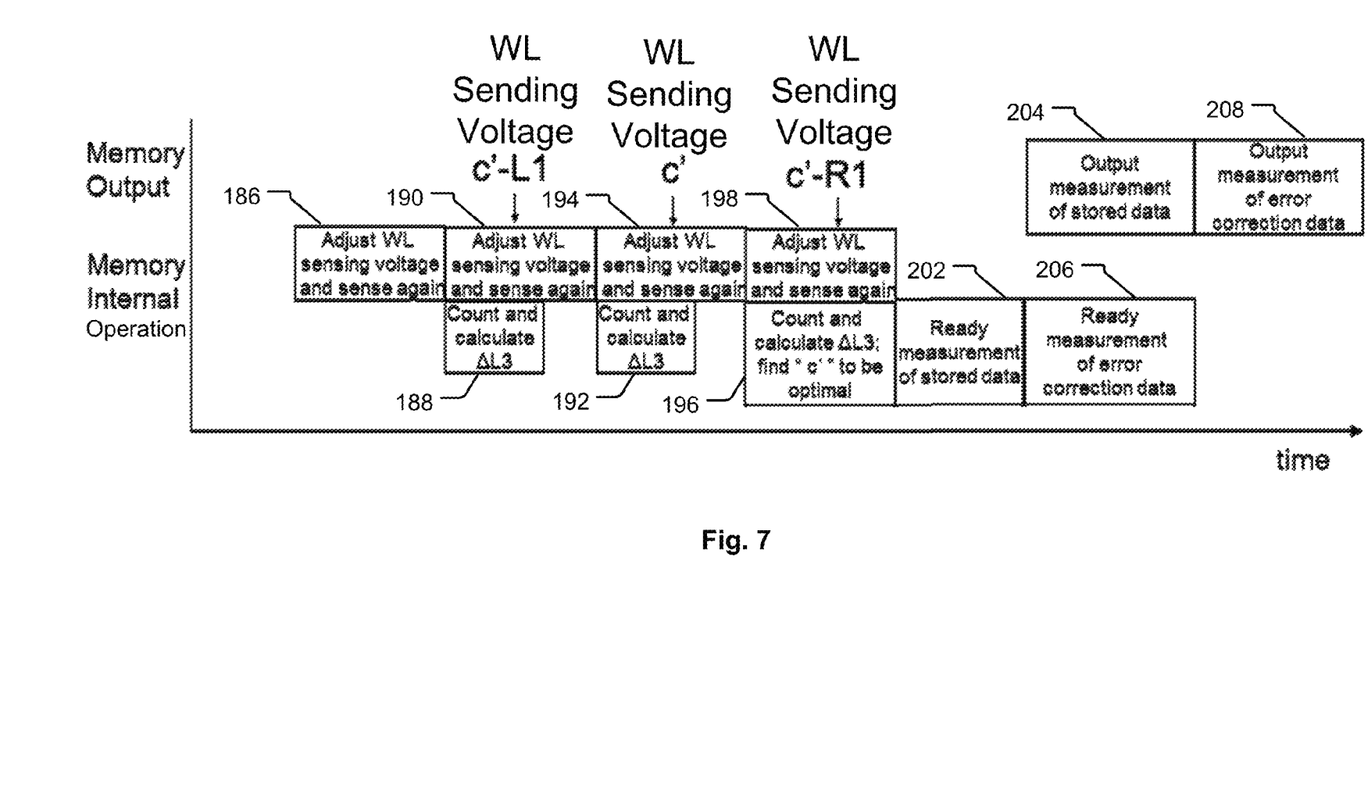

FIGS. 6 and 7 are an example timeline of a read operation which includes a combined measurements of data stored on memory cells of error correction data of the memory cells from the same memory sense operation In 162, as memory input, a read command is received. In 164, a sensing operation is performed with the default word line sensing voltage "a". From the sensing operation, measure if memory cell stores data in threshold voltage range above/below word line sensing voltage. The control circuit measures whether the memory cell stores data in a threshold voltage range above or below the adjusted word line sensing voltage. In 166, from the same sensing operation, a control circuit determines whether a result of the measurement exceeds a predetermined error limit, by counting and calculating ΔL1. The error type is determined by the sign of ΔL1. In this case, the measurement exceeds a predetermined error limit, so the word line sensing voltage will be adjusted to repeat the measurement, with the direction of the adjustment being determined by the sign of ΔL1.

In 168, a sensing operation is performed with an adjusted word line sensing voltage. Again, from the sensing operation, the data stored in the memory cell are measured. From this point, because sensing operations have been performed with different word line sensing voltages, the error correction data of whether the threshold voltage of the memory cells falls within the range between the present word line sending voltage and a prior word line sending voltage are measured again from the same sensing operation. Again, in 170, from the same sensing operation, the control circuit determines whether a result of the measurement exceeds a predetermined error limit, by counting and calculating ΔL1. Again in this case, the measurement exceeds a predetermined error limit, so the word line sensing voltage will be adjusted to repeat the measurement, with the direction of the adjustment being determined by the sign of ΔL1.

In 172, a sensing operation is performed with an adjusted word line sensing voltage of "a'-L1". Again, from the same sensing operation, the data stored in the memory cell are measured again, and the error correction data of whether the threshold voltage of the memory cells falls within the range between the present word line sending voltage and a prior word line sending voltage are measured again. Again, in 174, from the sensing operation, the control circuit determines whether a result of the measurement exceeds a predetermined error limit, by counting and calculating ΔL1. Again in this case, the measurement exceeds a predetermined error limit, so the word line sensing voltage will be adjusted to repeat the measurement, with the direction of the adjustment being determined by the sign of ΔL1.

In 176, a sensing operation is performed with an adjusted word line sensing voltage of "a'". Again, from the same sensing operation, the data stored in the memory cell are measured again, and the error correction data of whether the threshold voltage of the memory cells falls within the range between the present word line sending voltage and a prior word line sending voltage are measured again. Again, in 178, from the sensing operation, the control circuit determines whether a result of the measurement exceeds a predetermined error limit, by counting and calculating ΔL1. Finally in this case, the measurement falls within a predetermined error limit, so the word line sensing voltage is not adjusted to repeat the measurement of data stored in the memory cell. However, the word line sensing voltage will be adjusted to measure additional error correction data, with the direction of the adjustment being determined by the type of error correction data already gathered and the type of error correction data remaining to be gathered.

In 180, a sensing operation is performed with an adjusted word line sensing voltage of a'-R1. From the sensing operation, the control circuit determines measures the error correction data of whether the threshold voltage of the memory cells falls within the range between the present word line sending voltage and a prior word line sending voltage.

The preceding 164-180 are repeated for 182-198, but with the default word line sensing voltage "c" instead of "a".

In 202, the measurements of stored data are readied. In 204, the measurements of stored data are output. In 206, the measurements of error correction data are readied. In 208, the measurements of error correction data are output.

Subsequently, error correction can be performed. The error correction can be performed on a group of cells, such as a whole memory page, or a partial memory page.

Figure 8:
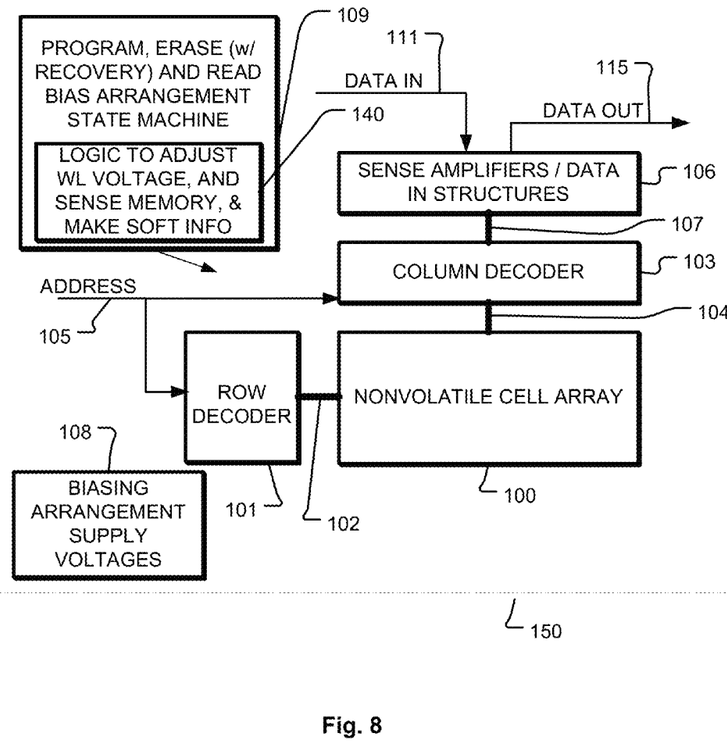
FIG. 8 is an example block diagram of an integrated circuit that combines measurements of data stored on memory cells of error correction data of the memory cells from the same memory sense operation

FIG. 8 is an example block diagram of an integrated circuit that combines measurements of data stored on memory cells of error correction data of the memory cells from the same memory sense operation.

An integrated circuit 150 includes a memory array 100. A word line (or row) and block select decoder 101 is coupled to, and in electrical communication with, a plurality of word lines 102, and arranged along rows in the memory array 100. A bit line (column) decoder and drivers 103 are coupled to and in electrical communication with a plurality of bit lines 104 arranged along columns in the memory array 100 for reading data from, and writing data to, the memory cells in the memory array 100. Addresses are supplied on bus 105 to the word line decoder and drivers 101 and to the bit line decoder 103. Sense amplifiers and data-in structures in block 106, are coupled to the bit line decoder 103 via the bus 107. Data is supplied via the data-in line 111 from input/output ports on the integrated circuit 150, to the data-in structures in block 106. Data is supplied via the data-out line 115 from the sense amplifiers in block 106 to input/output ports on the integrated circuit 150, or to other data destinations internal or external to the integrated circuit 150. Program, erase, and read bias arrangement state machine circuitry 109 controls biasing arrangement supply voltages 108, and applies a recovery bias arrangement during erase. State machine circuitry 109 also includes logic 140 that adjusts word line voltage, and makes multiple memory measurements with the same memory sense operations. The multiple memory measurements determine the data stored in memory cells and generate soft information such as error correction data for the memory cells.

In one embodiment, the memory chip sends the sensing results for soft data to the controller directly, and the calculation of the soft data is performed outside the memory chip. The soft data can be stored in a buffer or other storage in the controller outside the memory chip. The off-chip buffer requires less overhead on the memory chip, but increases transfer times.

In another embodiment, the memory chip performs the calculation of the soft data on the memory chip, and sends the calculated probabilities to the controller. The soft data can be stored in a buffer or other storage on the memory chip. The on-chip buffer requires more overhead on the memory chip, but decreases transfer times.

The buffer or other storage may require a larger storage space for the soft data than for the original data characterized by the soft data, since the data represents error probabilities and can be multiple bits per original data bit. When a page of data is read from the memory array, the soft data of the corresponding page of data is stored in the buffer.

Various embodiments have the following variations: a different number of adjustments of WL sensing level; rearranged steps, one or more added steps, and or one or more deleted steps in the read sequence of FIGS. 6-7; execution of one or more steps in one or more locations (for example, the "count and calculate" steps in an external flash controller).

The technology can be applied to various memories, and can be implemented by hardware, software, and or firmware. The technology can be implemented in one or more layers of a system such as memory management unit MMU, CPU, and or hardware IP.

The technology can be applied to single level cell SLC or multi level cell MLC. Various embodiments cover different numbers of bits/cell.

This technology is suitable for memories with a lifetime limitation, such as NAND flash, NOR flash, phase change memory, magnetic RAM, and resistive RAM.

Various embodiments apply the soft data to error correction such that no errors remain after performing an algorithm, such as ECC; and/or apply error reduction such that errors are reduces although errors remain, such as adjusting the sensing voltage to an optimal voltage.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A memory operation method, comprising:
making a plurality of measurements with one memory sense operation having a first word line sensing voltage on a memory cell, the plurality of measurements including:
(i) a first measurement, of whether the memory cell stores either:
(a) data corresponding to a first set of one or more threshold voltage ranges below the first word line sensing voltage of the one memory sense operation, or
(b) data corresponding to a second set of one or more threshold voltage ranges above the first word line sensing voltage of the one memory sense operation, and
(ii) a second measurement, of error correction data of the memory cell, the error correction data indicating relative position within a particular threshold voltage range of the first set or second set, of a stored threshold voltage in the memory cell; and
responsive to determining that the first word line sensing voltage results in the first measurement exceeding a predetermined error limit, repeating the first measurement on the memory cell with a second word line sensing voltage replacing the first word line sensing voltage.

2. The method of claim 1, wherein the error correction data indicates whether the memory cell has a stored threshold voltage within a sub-range narrower than one of a plurality of threshold voltage ranges, different threshold voltage ranges in the plurality of threshold voltage ranges representing different data values storable by the memory cell.

3. The method of claim 1, wherein the error correction data indicates whether the memory cell has a stored threshold voltage between the first word line sensing voltage and the second word line sensing voltage.

4. The method of claim 1, wherein a first result of the first measurement with the first word line sensing voltage is discarded in favor of a second result of the first measurement with the second word line sensing voltage.

5. The method of claim 1, further comprising:
responsive to determining that the first word line sensing voltage results in the first measurement exceeding a predetermined error limit, repeating the first measurement on the memory cell with a succession of replacement word line sensing voltages until one of the replacement word line sensing voltages results in the first measurement meeting the predetermined error limit.

6. The method of claim 5, wherein the error correction data indicates whether the memory cell has a stored threshold voltage between two of the replacement word line sensing voltages.

7. The method of claim 5, wherein an earlier result of the first measurement with an earlier one of the succession of replacement word line sensing voltages is discarded in favor of a later result of the first measurement with a later one of the succession of replacement word line sensing voltages.

8. The method of claim 1, wherein the first measurement with the first word line sensing voltage is an intermediate word line sensing voltage in a moving read operation on the memory cell.

9. The method of claim 1, wherein the error correction data is used for at least one of error correction and error reduction on the memory cell.

10. An integrated circuit with memory, comprising:
a memory array with a plurality of memory cells storing data represented by one of a plurality of threshold voltage ranges; and
control circuitry coupled to the memory array, the control circuitry making a plurality of measurements with one memory sense operation having a first word line sensing voltage on a memory cell of the memory array, the plurality of measurements including:
(i) a first measurement, of whether the memory cell stores either:
(a) data corresponding to a first set of one or more threshold voltage ranges below the first word line sensing voltage of the one memory sense operation, or
(b) data corresponding to a second set of one or more threshold voltage ranges above the first word line sensing voltage of the one memory sense operation, and
(ii) a second measurement, of error correction data of the memory cell, the error correction data indicating relative position within a particular threshold voltage range of the first set or second set, of a stored threshold voltage in the memory cell, wherein the control circuitry performs, responsive to determining that the first word line sensing voltage results in the first measurement exceeding a predetermined error limit, repeating the first measurement on the memory cell with a second word line sensing voltage replacing the first word line sensing voltage.

11. The circuit of claim 10, wherein the error correction data indicates whether the memory cell has a stored threshold voltage within a sub-range narrower than one of a plurality of threshold voltage ranges, different threshold voltage ranges in the plurality of threshold voltage ranges representing different data values storable by the memory cell.

12. The circuit of claim 10, wherein the error correction data indicates whether the memory cell has a stored threshold voltage between the first word line sensing voltage and the second word line sensing voltage.

13. The circuit of claim 10, wherein a first result of the first measurement with the first word line sensing voltage is discarded in favor of a second result of the first measurement with the second word line sensing voltage.

14. The circuit of claim 10, further comprising:
responsive to determining that the first word line sensing voltage results in the first measurement exceeding a predetermined error limit, repeating the first measurement on the memory cell with a succession of replacement word line sensing voltages until one of the replacement word line sensing voltages results in the first measurement meeting the predetermined error limit.

15. The circuit of claim 14, wherein the error correction data indicates whether the memory cell has a stored threshold voltage between two of the replacement word line sensing voltages.

16. The circuit of claim 14, wherein an earlier result of the first measurement with an earlier one of the succession of replacement word line sensing voltages is discarded in favor of a later result of the first measurement with a later one of the succession of replacement word line sensing voltages.

17. The circuit of claim 10, wherein the error correction data is used for at least one of error correction and error reduction on the memory cell.

18. A reading method of a memory having ECC circuitry, comprising:

sensing the memory with a first word line voltage to get data of the memory, the data represented by a particular threshold voltage range of a stored threshold voltage in the memory cell, the particular threshold voltage range being one of a plurality of threshold voltage ranges representing different data values;

adjusting the first word line voltage to a second word line voltage;

sensing the memory with the second word line voltage to get error correction data for the data of the memory cell for the ECC circuitry, wherein the error correction data circuitry indicates relative position within the particular threshold voltage range; and responsive to determining that the first word line voltage results in a first measurement exceeding a predetermined error limit, repeating the first measurement on the memory cell to get the data of the memory with a third word line sensing voltage replacing the first word line sensing voltage.

\* \* \* \* \*